United States Patent [19]
Imahashi et al.

[11] Patent Number: 5,342,472
[45] Date of Patent: Aug. 30, 1994

[54] PLASMA PROCESSING APPARATUS

[75] Inventors: Issei Imahashi; Nobuo Ishii, both of Yamanashi, Japan

[73] Assignee: Tokyo Electron Limited, Tokyo, Japan

[21] Appl. No.: 928,428

[22] Filed: Aug. 12, 1992

[30] Foreign Application Priority Data

Aug. 12, 1991 [JP] Japan .................. 3-228270

[51] Int. Cl.$^5$ .............................. H05H 1/00
[52] U.S. Cl. .................. 156/345; 156/643; 204/298.38; 118/723 R
[58] Field of Search ............ 156/345, 643; 118/723; 204/298.16, 298.37, 298.38

[56] References Cited
U.S. PATENT DOCUMENTS

| | | | |
|---|---|---|---|
| 4,672,346 | 6/1987 | Miyamoto et al. | 335/296 |
| 4,985,109 | 1/1991 | Otsubo et al. | 156/345 |
| 5,013,401 | 5/1991 | Samukawa et al. | 156/345 X |
| 5,034,086 | 7/1991 | Sato | 156/345 |
| 5,078,851 | 1/1992 | Nishihata et al. | 156/345 X |
| 5,181,986 | 1/1993 | Ohiwa | 156/643 |

FOREIGN PATENT DOCUMENTS

| | | | |
|---|---|---|---|
| 288023 | 11/1988 | Japan | 156/345 |
| 2322 | 1/1989 | Japan | 156/345 |
| 148635 | 1/1989 | Japan | 156/345 |
| 81321 | 3/1989 | Japan | 156/345 |
| 236628 | 9/1989 | Japan | 156/345 |
| 94628 | 4/1990 | Japan | 156/345 |

*Primary Examiner*—Thi Dang
*Attorney, Agent, or Firm*—Oblon, Spivak, McClelland, Maier & Neustadt

[57] ABSTRACT

Microwave inlet ports are formed on a microwave transmission window above a plasma generation chamber. The distance from the microwave inlet ports to a support surface of a wafer support table is set to be an integer multiple of ½ the wavelength of the microwave. Upper and lower magnetic poles opposite to each other are arranged above and below the chamber to form a magnetic field having a uniform strength in the chamber. The strength of the magnetic field is set to be 865 Gauss as a value slightly deviating from 875 Gauss as a value satisfying ideal conditions of an electron cyclotron resonance at a microwave wavelength of 2.45 GHz. The electron energy is suppressed, and damage to the surface of a wafer can be suppressed in wafer surface processing using a plasma.

15 Claims, 6 Drawing Sheets

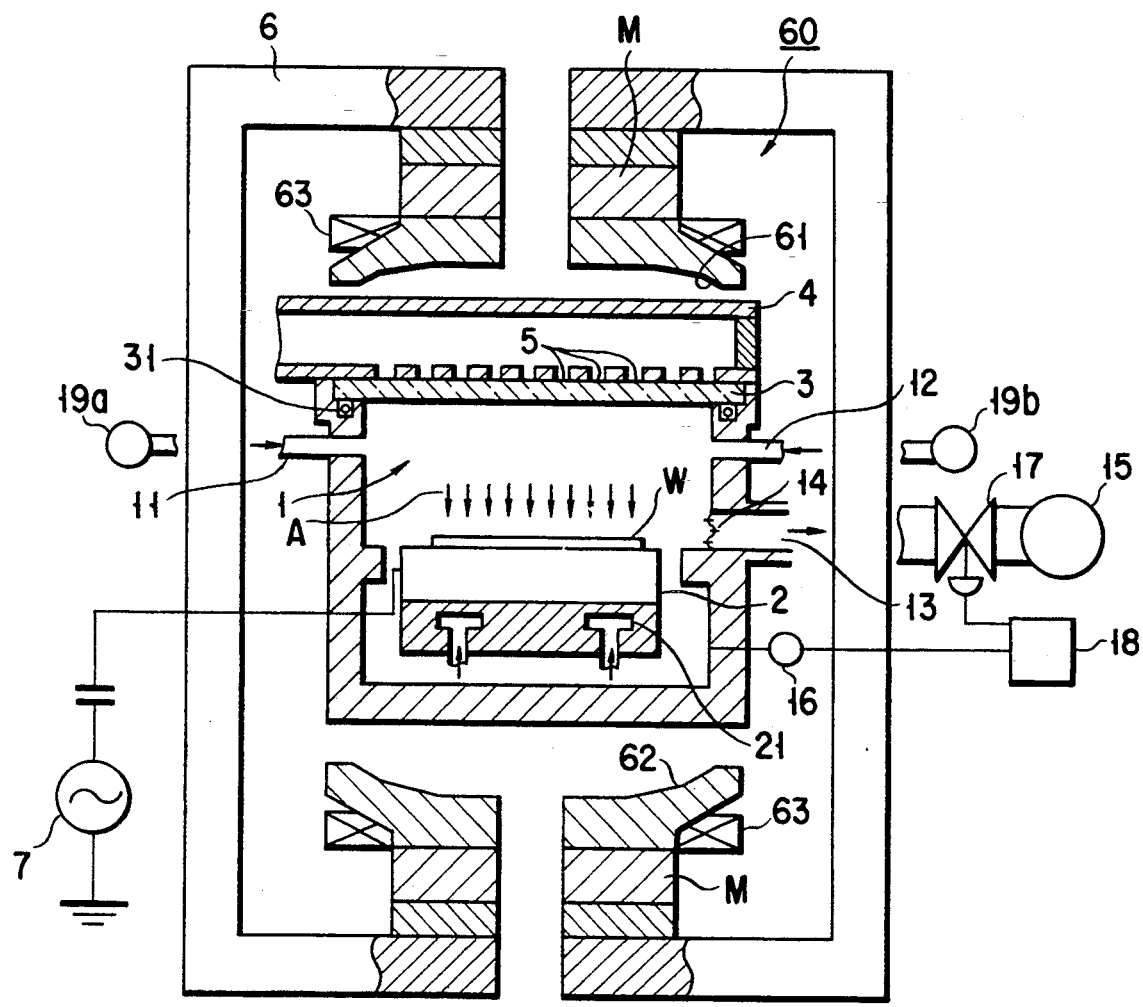
F I G. 1

PLASMA PROCESSING APPARATUS

BACKGROUND OF THE INVENTION

1. Field of the Invention

The present invention relates to a plasma processing apparatus and, more particularly, to a processing apparatus in which a plasma is generated by an electron cyclotron resonance caused by a microwave and a magnetic field and a semiconductor wafer is processed (e.g., etched) by using this generated plasma.

2. Description of the Related Art

In recent years, Since micropatterning of semiconductor devices has been rapidly developed, demands for micropatterning precision, low contamination, less damage, and selectivity in dry-etching techniques have become stricter.

A method of causing a microwave discharge using a resonance phenomenon between an electron cyclotron motion and a microwave in a magnetic field has been recently employed. According to this microwave discharge, since a plasma having a high density can be generated by a non-electrode discharge in a low pressure, a high-speed surface treatment can be performed, and wafers are free from contamination, thus providing industrial advantages.

An example of a conventional plasma processing apparatus of this type is described in Published Examined Japanese Patent Application No. 58-13626. In this disclosed apparatus, a microwave is supplied downward into a plasma generation chamber around which a magnetic field forming means is arranged. A plasma is then generated by an electron cyclotron resonance. Ions in this plasma are extracted by an ion extraction electrode into a processing chamber from the bottom portion of the plasma generation chamber and are radiated on the surface of a target object located inside the processing chamber.

Another example of an apparatus of this type is described in Published Unexamined Japanese Patent Application No. 59-202635. In this disclosed apparatus, a discharge tube constituting a plasma generation chamber has a structure tapered wider from a microwave supply direction to the direction of a target object, and at the same time has a magnetic gradient. Therefore, ions can be transported to the target body and plasma processing in a wide area can be performed.

In the former apparatus, i.e., the apparatus described in Published Examined Japanese Patent Application No. 59-13626, the processing chamber must be arranged independently of the plasma generation chamber, resulting in a bulky apparatus. In addition, since a high voltage of about 1,000 V is required as an ion extraction voltage, the ion energy is high, and the surface of the target object is greatly damaged.

In the latter apparatus, i.e., the apparatus described in Published Unexamined Japanese Patent Application No. 59-202635, since the magnetic gradient is present from the plasma generation region to the surface of the target object, the lines of magnetic force are inclined with respect to the surface of the target object, so that the ions are obliquely incident on the surface of the target object. Therefore, for example, perpendicular etching performance is degraded, and excellent micropatterning becomes difficult.

On the other hand, when a target object is placed in the plasma generation chamber and a magnetic field having a uniform strength is formed in the plasma generation chamber, the separate processing chamber need not be arranged, and ions can be perpendicularly incident on the surface of the target object. In this case, however, the energy (temperature) of the electrons generated by an electron cyclotron resonance phenomenon is extremely increased. In addition, since a probability of collision between electrons and ions is low at a low pressure, the surface of the target object are bombarded with electrons having a high energy to cause a charge-up phenomenon, thereby increasing the floating potential to, e.g., 100 eV. For this reason, when ions pass through an ion sheath, their energy is considerably increased, and the ions having the high energy strike the surface of the target object. In addition to the bombardment with electrons having a high energy, thermal, electrostatic damage to the surface of the target object is increased. The energy of the microwave is absorbed in the target object to undesirably heat the target object to a high temperature.

SUMMARY OF THE INVENTION

It is, therefore, an object of the present invention to suppress damage to the surface of an object to be processed in a plasma processing apparatus in which a plasma is generated by an electron cyclotron resonance caused by a microwave and a magnetic field.

The present invention is based on the findings that when an object to be processed is placed in a plasma generation chamber, a magnetic field having a uniform strength is formed in the plasma generation chamber, and a plasma is generated in conditions slightly deviating from ideal conditions of the electron cyclotron resonance, the electron energy is kept lower in consideration of high-energy electrons which cause damage to the object.

More specifically, according to the present invention, there is provided a method of generating a plasma by an electron cyclotron resonance and processing a substrate by using this plasma, comprising the steps of:

providing a processing chamber having a support surface for supporting the substrate so as to form a discharge space formed above the support table within the chamber;

placing the substrate on the support surface;

setting an interior of the chamber to a vacuum atmosphere;

supplying a processing gas to be converted into the plasma in the chamber;

supplying a microwave to the discharge space; and forming a magnetic field having a uniform strength in the discharge space, the strength of the magnetic field being set to be a value deviating from ideal conditions of the electron cyclotron resonance by 0.3% to 1.8%.

According to the present invention, since the deviation from the ideal conditions of the electron cyclotron resonance is small, the electron cyclotron resonance phenomenon occurs, but the electron energy can be suppressed compared to the case wherein the ideal conditions of the electron cyclotron resonance are satisfied. As a result, the floating potential is decreased, and the energy of ions which strike the surface of the substrate is set to have an appropriate magnitude, thereby suppressing damage to the surface of the substrate.

Since the distance from the support surface of the support table to a microwave inlet port is set to be an integer multiple of $\frac{1}{2}$ the wavelength of the microwave, the microwave power can be effectively absorbed in the plasma. Since the microwave is reflected by the support surface, heating of the substrate can be suppressed.

A dielectric body is bonded to the conductive plate having the microwave inlet ports to reduce the distance between the inlet ports, thereby increasing the density of the microwave. Therefore, uniform plasma processing within the surface of the substrate placed opposite to the microwave inlet ports can be performed.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 1 is a sectional view showing a plasma processing apparatus according to the first embodiment of the present invention;

DETAILED DESCRIPTION OF THE PREFERRED EMBODIMENTS

Figure 2:
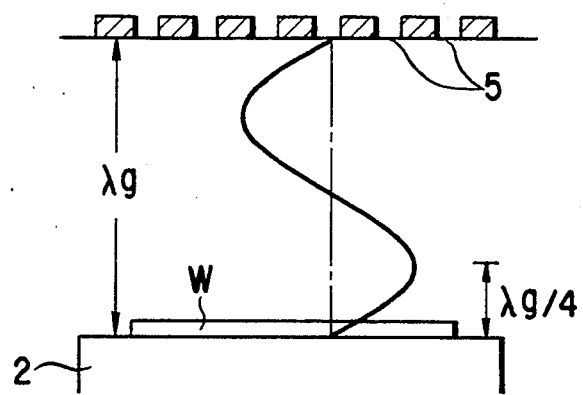
FIG. 2 is a view for explaining the relationship between the position of the support surface of a wafer support table and the wavelength of a microwave.

FIG. 1 is a longitudinal sectional view showing a plasma processing apparatus according to the first embodiment of the present invention. Reference numeral 1 denotes a plasma generation chamber for forming a discharge space for generating a plasma by an electron cyclotron resonance. The plasma generation chamber 1 is made of a cylindrical member having a diameter of, e.g., 600 mm, and the wall portion thereof is made of a non-magnetic material such as an aluminum alloy or stainless steel. A conductive wafer support table 2 serving as a support means for supporting a semiconductor wafer W as an object to be processed is disposed at the bottom portion of the chamber 1. The support table 2 electrically floats from the chamber 1. A coolant path 21 for circulating a coolant such as cooling water for cooling of about $-50°$ C. or liquid nitrogen for cooling of about $-150°$ is formed in the support table 2 to cool the wafer on the support table 2.

Gas supply pipes 11 and 12 connected to sources 19a and 19b of etching gases such as $Cl_2$, $SF_4$, and $CF_4$ are connected to the chamber 1. An exhaust pipe 13 coupled to an evacuating means 15 is connected to the chamber 1 to maintain the interior of the chamber 1 in a predetermined vacuum atmosphere. A pressure gauge 16 is connected to the chamber 1, and a pressure regulation valve 17 is arranged in the exhaust pipe 13. The pressure gauge 16 is connected to the pressure regulation valve 17 through a controller 18 in a known manner. The pressure regulation valve 17 is operated by the controller 18 in accordance with an internal pressure of the chamber 1 which is detected by the pressure gauge 16.

A filter 14 made of a conductive mesh member for shielding a microwave (to be described later) is arranged in the exhaust port of the exhaust pipe 13. The upper surface of the plasma generation chamber 1 is formed of a microwave transmission window 3 made of, e.g., quartz glass. This window 3 is mounted on the upper end of the wall portion of the chamber 1 with an O-ring 31 interposed.

A rectangular waveguide 4 having a flat hollow structure is disposed above the chamber 1. This waveguide 4 is connected to a magnetron or microwave generator (corresponding to a portion denoted by reference numeral 86 in FIG. 7) serving as a microwave source. A microwave having a frequency of, e.g., 2.45 GHz is guided from the side portion of the plasma generation apparatus main body to a portion above the chamber 1. A plurality of slit-like microwave inlet ports 5 are formed in the lower surface of the end portion of the waveguide 4 and face the upper surface of the microwave transmission window 3. The width of the slit of each inlet port 5 is determined to be, e.g., ($\lambda t/2 \times 1$ cm) if the wavelength of the microwave in the waveguide 4 is defined as $\lambda t$. A microwave absorbing body 41 for absorbing reflected waves generated in the waveguide 4 is formed at the end face of the waveguide 4. The absorbing body 41 prevents return of the reflected waves to the magnetron. The absorbing body 41 is cooled to prevent heating of the waveguide 4.

The region from the microwave inlet ports 5 to the support surface of the wafer support table 2 constitutes a microwave cavity resonator structure. The distance between the microwave inlet ports 5 and the support surface of the wafer support table 2 is determined to be ($\lambda g/2$) $\times n$ (integer), e.g., ($\lambda g/2$) $\times 2$ if the wavelength of the microwave supplied from the inlet ports 5 to the chamber 1, as shown in FIG. 2, is defined as $\lambda g$. When the above microwave cavity resonator structure is obtained, the microwave power can be more efficiently absorbed in the plasma. In addition, since the support surface of the support table 2 is located at the surface for reflecting the microwave, the support table 2 is not heated by the microwave. Since the power of the microwave absorbed in the wafer is close to zero, an increase in temperature of the wafer by the microwave can also be prevented.

An upper magnetic pole 61 is located above the chamber 1 through the waveguide 4, and a lower magnetic pole 62 is located below the chamber 1 so as to oppose the upper magnetic pole 61. The magnetic poles 61 and 62 are coupled by a yoke 6 made of, e.g., soft iron through a permanent magnet M. Magnetic field generation coils 63 are wound around the magnetic poles 61 and 62, respectively. In this embodiment, the magnetic poles 61 and 62, the coils 63, the yoke 6, and the permanent magnet M constitute a magnetic field forming means 60. The magnetic flux density of the magnetic field forming means 60 has a uniform magnitude within the plasma generation chamber 1. The magnetic field forming means 60 generates a downward magnetic field having lines A of magnetic force perpendicular to the surface of a wafer W. The magnetic flux density in the plasma generation chamber 1 is set to be 865 Gauss lower than 875 Gauss which can satisfy the ideal conditions of the electron cyclotron resonance when the frequency of the microwave is set to be, e.g., 2.45 GHz.

The operation of the first embodiment will be described below.

A microwave having a power of, e.g., 800 W and a frequency of, e.g., 2.45 GHz propagates from the magnetron to the waveguide 4 and is supplied from the inlet ports 5 to the chamber 1 through the window 3 in, e.g., a TE mode. Upon excitation of the permanent magnet M and the magnetic field generation coils 63 of the magnetic field forming means 60, a magnetic field whose magnetic flux density is, e.g., 865 Gauss and the direction of the lines A of magnetic force is downward is generated in a direction perpendicular to the surface of the wafer W on the support table 2 in the chamber 1.

On the other hand, an etching gas such as chlorine gas is supplied from the gas supply pipes 11 and 12 to the chamber 1 at a flow rate of 10 SCCM. The interior of the chamber 1 is maintained at a pressure of, e.g., about $1 \times 10^{-4}$ Torr by the evacuating means 15.

Since the magnitude of the magnetic flux density which satisfies the ideal conditions of the electron cyclotron resonance which correspond to the wavelength of the microwave is 875 Gauss, the magnetic flux density of the field generated in the plasma generation chamber 1 has a slightly smaller value, i.e., 865 Gauss. However, since this difference is very small, an electron cyclotron resonance phenomenon occurs in the chamber 1. In this embodiment, since the region from the microwave inlet ports 5 to the support surface of the wafer support table 2 serves as the cavity resonator structure, the microwave power can be efficiently absorbed in the electrons, and the energy (temperature) of the electrons is increased. Ions whose energy is increased upon collision with the electrons are accelerated by the floating potential of the wafer W and strike the surface of the wafer W, thereby performing surface processing, e.g., etching.

As described in the "Description of the Related Art", when the magnetic flux density is set to be 875 Gauss, which can satisfy the ideal conditions of the electron cyclotron resonance, the electrons are heated to a high temperature corresponding to an energy of about 100 eV, and the thermal, electrostatic damage to the surface of the wafer is increased. To the contrary, according to the present invention, the magnetic flux density is set to be a value slightly deviating from 875 Gauss, thereby suppressing the damage to the surface of the wafer. The reason for this is surmised as follows.

According to the present invention, the temperature or energy of the electrons is increased by the electron cyclotron resonance phenomenon. Since the relationship between the magnetic flux density and the frequency of the microwave is shifted from the ideal conditions of the electron cyclotron resonance, the energy of the electrons is increased to a value between 10 and 20 eV and is then decreased. This increase/decrease cycle is repeated. For this reason, the temperature of the electrons is not extremely increased but is kept to be a small value. As a result, even if the surface of the wafer is charged up by the electrons, since the floating potential of the wafer is low, the energy of the ions to strike the surface of the wafer is lowered but is still high enough to perform the surface processing.

The intensity of the plasma is maximized at two positions spaced apart from the support table 2 upward by ($\frac{1}{4} \times \lambda g$) and ($\frac{3}{4} \times \lambda g$). However, when the window 3 is located at a position above the support table 2 by ($\frac{1}{2} \times \lambda g$), the position of the maximum intensity of the plasma is limited to only one position above the support table 2, thus forming a planar plasma on the surface of the wafer and hence performing good surface processing. In this case, although the position of the maximum intensity of the plasma is located near the wafer, thermal, electrostatic damage to the wafer can be prevented due to the low temperature of the electrons described above.

When the microwave power is further increased, a probability of collision between electrons and ions tends to increase. In order to set the electron temperature and the collision probability to appropriate values, the deviation from the ideal conditions of the electron cyclotron resonance and the microwave power are appropriately selected.

In the first embodiment, an RF power source 7 may be connected, as shown in FIG. 1, to apply a bias potential to the support table 2. In this case, ion extraction can be further efficiently performed.

Figure 3:
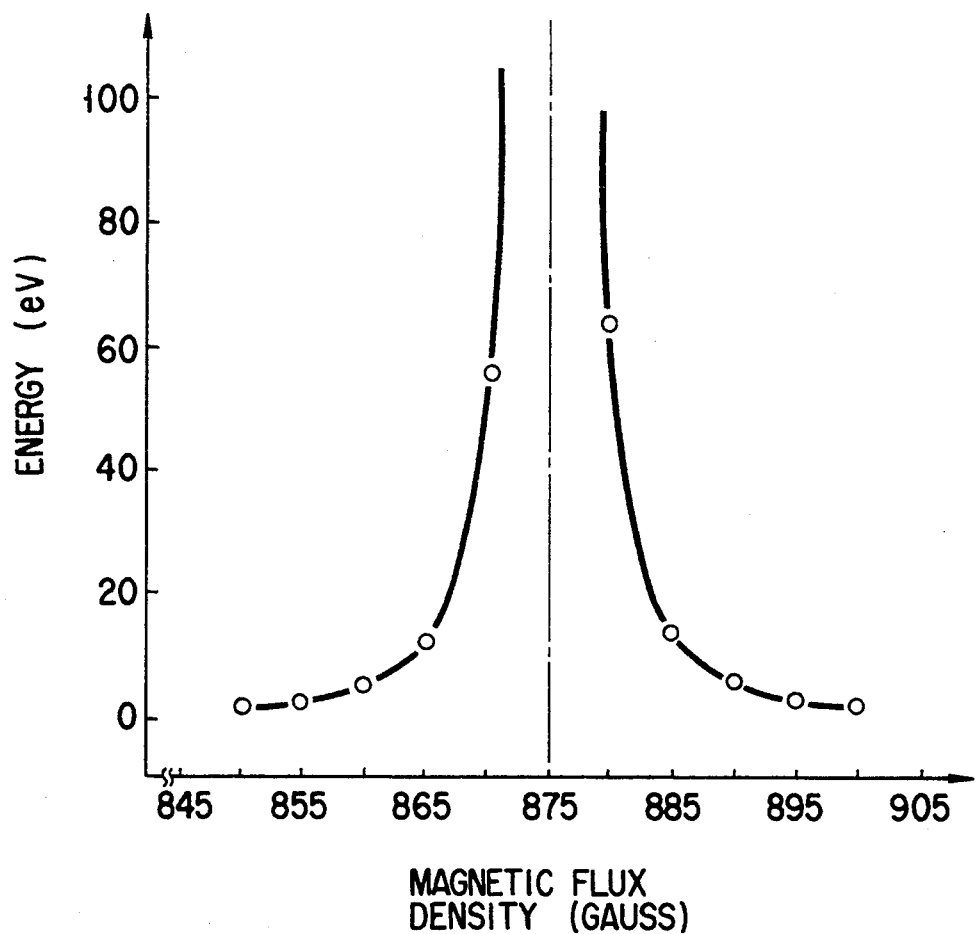
FIG. 3 is a graph showing the relationship between the magnetic flux density and the electron energy.

In order to examine an appropriate deviation from the ideal conditions of the electron cyclotron resonance so as to examine the relationship between the magnetic flux density and the microwave frequency, energy values (temperature values) of electrons in a plasma as a function of the magnitude of the magnetic flux density are numerically calculated using an electron cyclotron motion equation at a microwave frequency of 2.45 GHz. The calculation results are shown in FIG. 3.

Judging from these results, the appropriate range of magnetic flux density deviations from the ideal conditions is ±0.3% to ±1.8% with respect to 875 Gauss as the center which satisfies the ideal conditions of the electron cyclotron resonance. In consideration of a more preferable electron energy range being about 10 ev to about 60 eV, the preferable range of the magnetic flux density deviations from the ideal conditions is assumed to be ±0.5% to ±1.5% with respect to 875 Gauss as the center. The above range is derived in consideration of the following three points. As is apparent from FIG. 3, when the magnetic flux density is set to be 875 Gauss which can satisfy the ideal conditions of the electron cyclotron resonance, the electron energy is infinitely large. However, when the magnetic flux density is set to be 875 Gauss, electrons actually collide against gas molecules and atoms, and the kinetic energy of the electrons is decreased. In practice, the electron energy is not infinitely large but is set to be about 100 eV. The electron temperature which allows good surface processing without damaging the wafer corresponds to an electron energy falling within the range of about 8 ev to about 80 ev.

The deviation from the ideal conditions of the electron cyclotron resonance is changed in accordance with changes in apparatus structure, but does not include a case in which the electron cyclotron resonance phenomenon does not occur at all.

Figure 4:
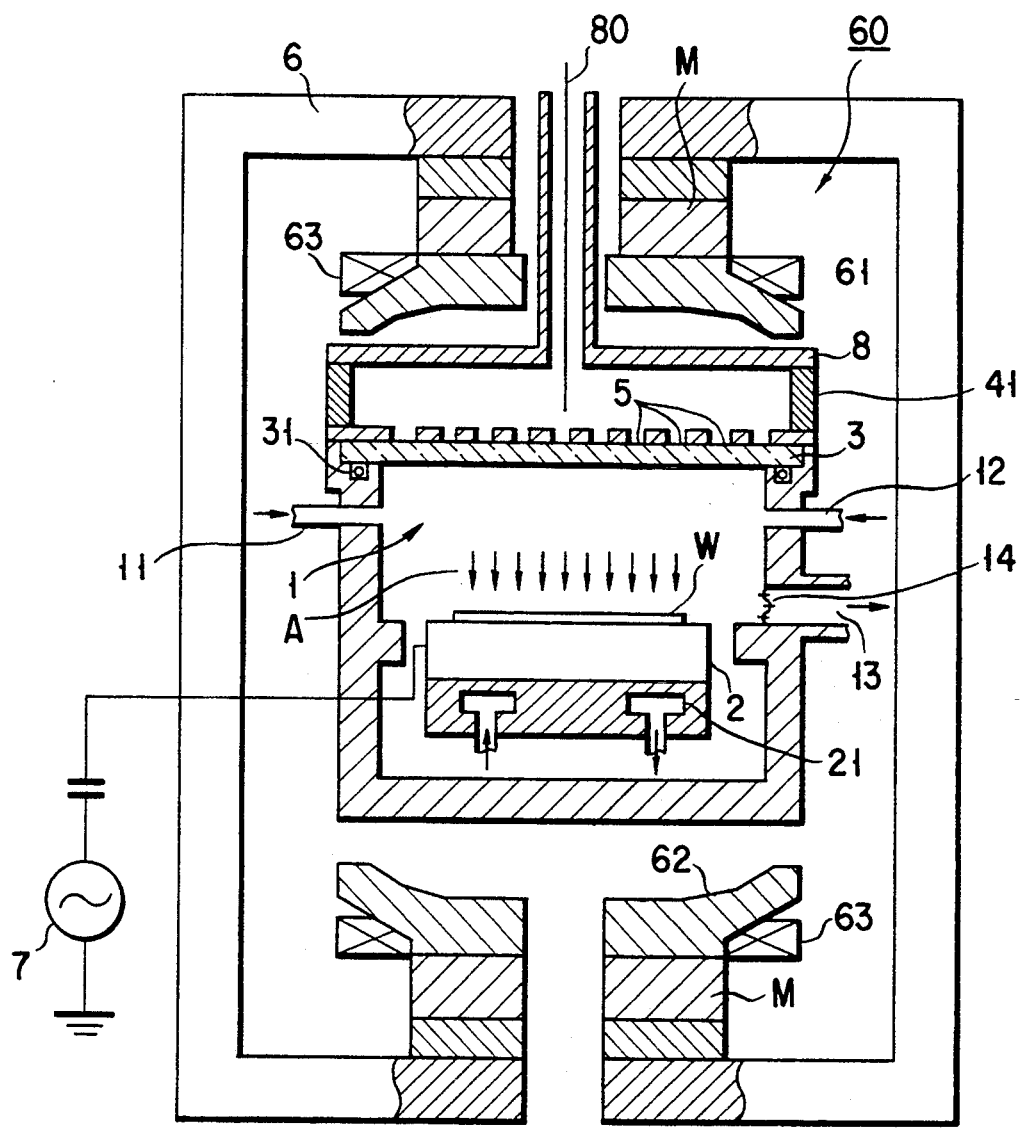
FIG. 4 is a sectional view showing a plasma processing apparatus according to the second embodiment of the present invention.

FIG. 4 is a longitudinal sectional view of a plasma processing apparatus according to the second embodiment of the present invention. The same reference numerals in FIG. 4 denote the same parts as in the first embodiment of FIG. 1, and a detailed description thereof will be omitted.

The second embodiment is different from the first embodiment in that a microwave is not supplied from the side of the apparatus main body but from the upper side. More specifically, a radial waveguide 8 is located above a chamber 1. A plurality of slit-like microwave inlet ports 5 are formed in the bottom surface of the waveguide 8 in the same manner as in the first embodiment. The microwave inlet ports 5 oppose the upper surface of a microwave transmission window 3. A coaxial cable 80 is inserted into the central opening of the upper surface of the waveguide 8. The coaxial cable 80 is connected to a magnetron or microwave generator (corresponding to a portion denoted by reference numeral 86 in FIG. 7) serving as a microwave source. In this embodiment, a yoke 6 for connecting upper and lower magnetic poles 61 and 62 is divided into four parts symmetrical about the vertical central line of the apparatus.

Figure 5:
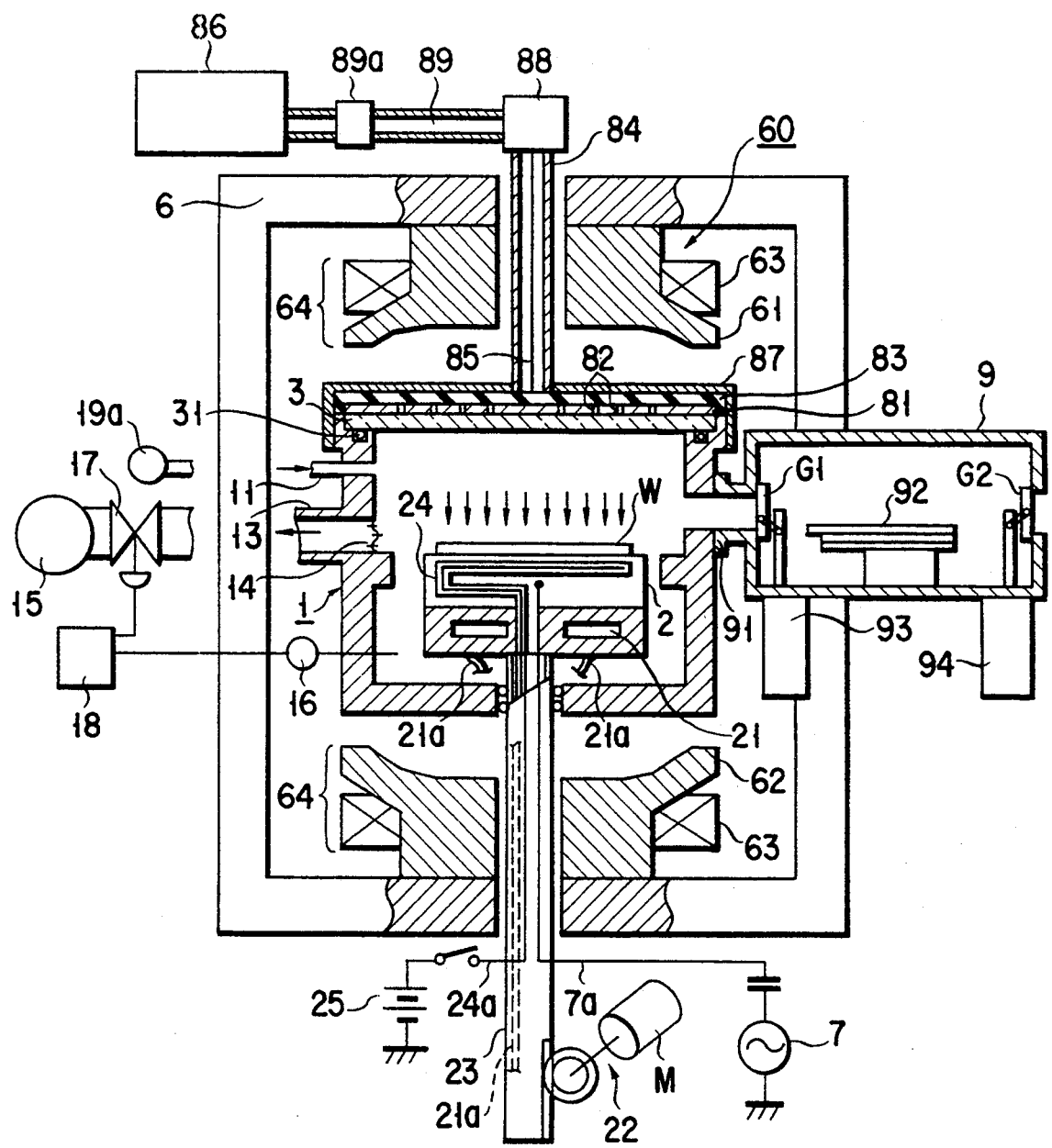
FIG. 5 is a sectional view showing a plasma processing apparatus according to the third embodiment of the present invention.
Figure 6:
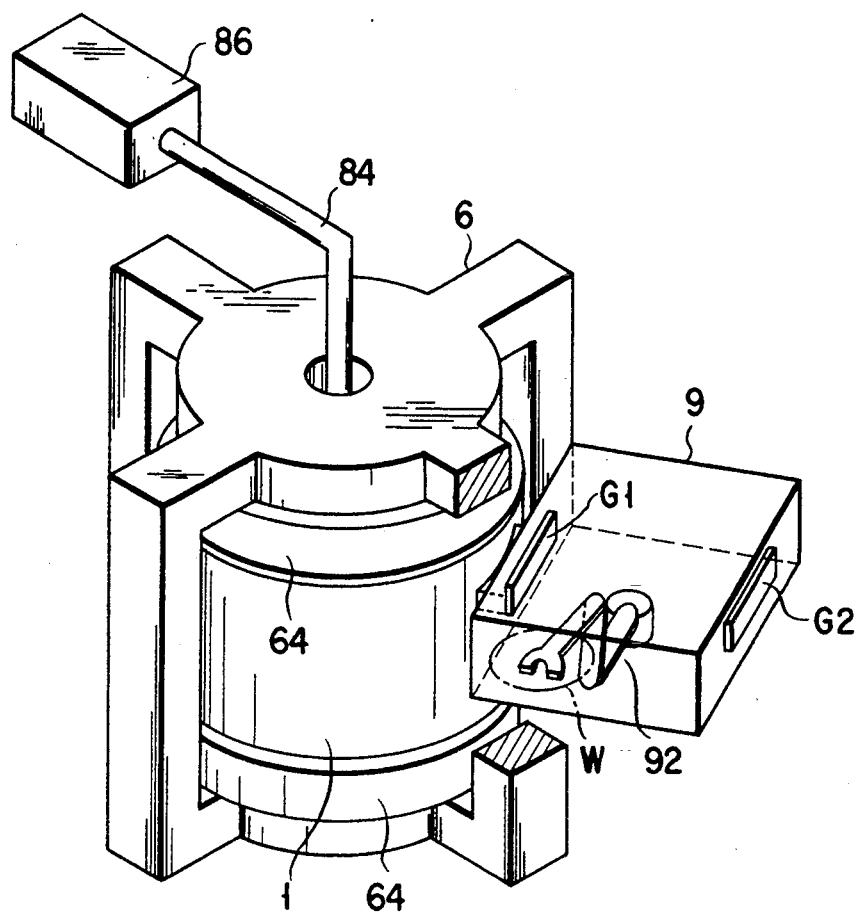
FIG. 6 is a perspective view showing the outer appearance of the apparatus shown in FIG. 5.

FIG. 5 is a longitudinal sectional view showing a plasma processing apparatus according to the third embodiment of the present invention, and FIG. 6 is a sectional view thereof. The same reference numerals in FIGS. 5 and 6 denote the same parts as in the first embodiment of FIG. 1, and a detailed description thereof will be omitted.

In this embodiment, a yoke 6 is divided into four parts symmetrical about the vertical central line, and at the same time, a corner portion of each of the four divided parts has a rectangular planar shape. In this case, even if the yoke 6 is not spread outward, the sectional area of the yoke 6 can be large, so that a high magnetic flux density can be obtained.

In this embodiment, no permanent magnets are used in the upper and lower sides of the yoke 6. Upper and lower magnetic poles 61 and 62 are arranged, and coils 63 are wound therearound to constitute an electromagnet 64. In this manner, when a magnetic field is generated by only the electromagnet 64, the strength of the magnetic field can be controlled by the magnitude of current supplied to coils 63, so that the conditions can be easily set and assembly is also facilitated.

Figure 7:
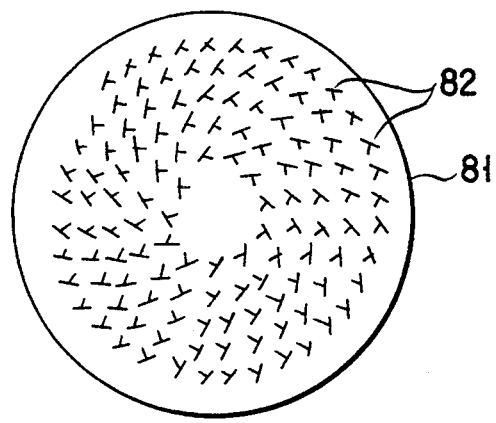
FIG. 7 is a plan view showing the structure of a metal plate having microwave inlet ports.

A metal plate 81 as a conductive member is arranged on the upper surface of a microwave transmission window 3. The metal plate 81 has T-shaped slits 82 serving as microwave inlet ports along a spiral line, as shown in FIG. 7. A ceramic plate 83 is bonded to the upper surface of the metal plate 81. The ceramic plate 83 is covered with a metal plate 87. The metal plates 81 and 87 are insulated from each other through the ceramic plate 83.

One end of a coaxial cable or line 84 is guided to the central portion of the upper surface of the ceramic plate 83 serving as a dielectric body through holes formed in the centers of the yoke 6 and the electromagnet 64. The outer conductive pipe of the line 84 is connected to the outer metal plate 87 which covers the ceramic plate 83. A central conductor 85 of the line 84 extends through the ceramic plate 83 and is brought into contact with the surface of the metal plate 81. A coaxial converter 88 is arranged at the upper end portion of the coaxial line 84, and a waveguide 89 is connected thereto at one end. The waveguide 89 is connected at the other end to a microwave generator 86 located above the yoke 6. A tuner 89a for adjusting impedance matching is arranged in the waveguide 89.

The dielectric constant of the ceramic is about 9, and the wavelength of the microwave propagating through the ceramic is about ⅓ that propagating in air. When the ceramic plate 83 is arranged on the metal plate 81 as described above, the pitch of the slits 82 of the metal plate 81 can be reduced. That is, the density of the slits 82 can be increased, so that uniform plasma processing can be performed on a wafer W. Since the lower end of the internal or central conductor 85 is in contact with the metal plate 81, no discharge occurs between the conductor 85 and the metal plate 81.

The end of the central conductor of the coaxial cable or line 84 need not be connected to the metal plate 81, but must be connected to at least the ceramic plate 83. For example, the central conductor extends into the ceramic plate 83 or is brought into contact with the surface of the ceramic plate 83.

A lifting mechanism 22 as a combination of a pinion-rack mechanism and a motor M for lifting a wafer support table 2 is located below the yoke 6. A lifting rod 23 extends through the holes in the central portions of the yoke 6 and the electromagnet 64. The upper end of the lifting rod 23 is connected to the support table 2. The support table 2 is vertically moved by the lifting mechanism 22 to load or unload the wafer W or adjust the distance between the metal plate 81 and the support table 2. An electrostatic chuck 24 is disposed on the upper surface of the wafer support table 2 to support and hold the wafer W. The electrostatic chuck 24 is connected to a DC power source 25 through a power supply line below the support table 2. The DC power source 25 is located outside the chamber 1.

The lifting rod 23 has a hollow structure. All of wiring lines 24a for the electrostatic chuck 24, wiring lines 7a of an RF power source 7 for applying a bias potential to the support table 2, and a line 21a for supplying a coolant to a coolant path 21 pass through the lifting rod 23 and are guided to the support table 2. With this structure, the vertical movement of the support table 2 can be smoothly performed.

A load lock chamber 9 is hermetically coupled to a plasma generation chamber 1 with an O-ring 91 interposed. A convey mechanism 92 for the wafer W, which is constituted by, e.g., an articulated arm, is arranged inside the load lock chamber 9. The load lock chamber 9 has gates G1 and G2 for opening or closing an opening portion between the load lock chamber 9 and the plasma generation chamber 1 and an opening portion between the load lock chamber 9 and the outer atmosphere. Reference numerals 93 and 94 denote drive mechanisms for driving the gates G1 and G2, respectively.

Figure 8:
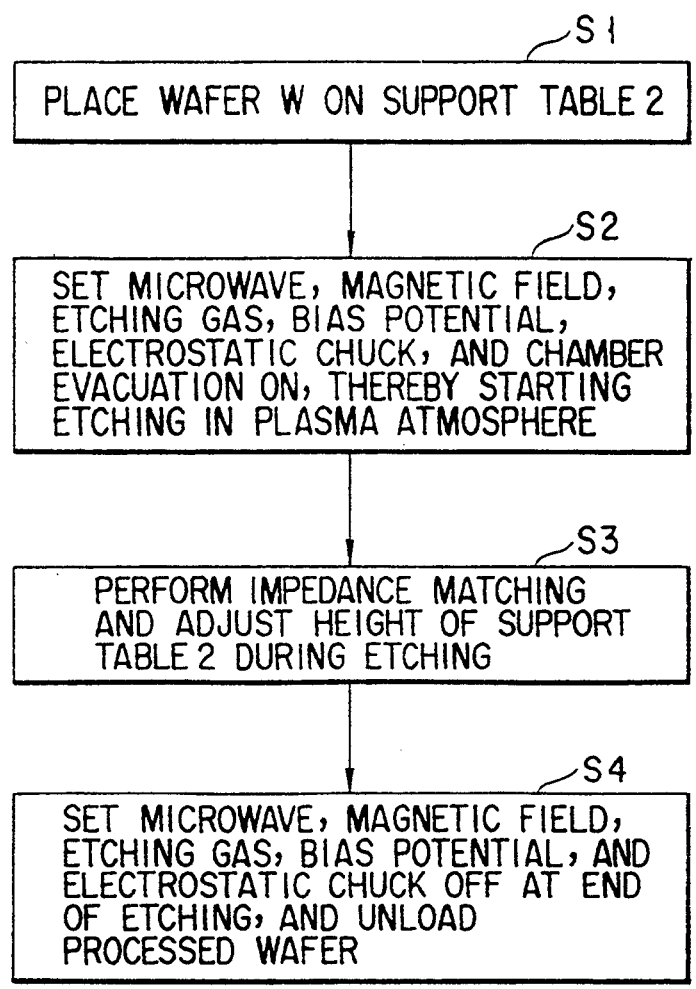
FIG. 8 is a schematic flow chart showing an etching process in the apparatus of the third embodiment.

The etching process of the semiconductor wafer by using the apparatus (FIG. 5) of the third embodiment will be described with reference to a flow chart in FIG. 8.

Step S1: After a wafer is loaded in the load lock chamber 9, the chamber 9 is set in the same vacuum state as that of the plasma generation chamber 1. The gate G1 is opened, and the wafer W is placed on the support table 2.

Step S2: A microwave having, e.g., a power of 800 W and a frequency of 2.45 GHz is supplied from the microwave generator 86. A magnetic field, whose magnetic flux density falls within the range of 895 Gauss q 0.1 to 1.5%, e.g., 865 Gauss and lines of magnetic forces are directed downward, is formed by a magnetic field forming means 60. Meanwhile, an etching gas such as chlorine gas is supplied from gas supply pipes 11 and 12 to the chamber 1 at a flow rate of 10 SCCM. At the same time, the internal pressure of the chamber 1 is maintained at, e.g., $1 \times 10^{-4}$ Torr by an evacuating means 15. An RF bias potential is supplied from the power source 7 to the support table 2, and at the same time, the electrostatic chuck 24 is turned on.

Since the magnetic flux density which satisfies the ideal conditions of the electron cyclotron resonance corresponding to the microwave frequency is 875 Gauss, the magnetic flux density of the magnetic field formed within the plasma generation chamber 1 is slightly lower (e.g., 865 Gauss) than the density satisfying the ideal conditions. However, since this difference is very small, an electron cyclotron resonance phenomenon occurs in the chamber 1. In this embodiment, since the region from the microwave inlet ports 5 to the support surface of the wafer support table 2 serves as the cavity resonator structure, the microwave power can be efficiently absorbed in the electrons, and the energy (temperature) of the electrons is increased. Ions whose energy is increased upon collision with the electrons are accelerated by the floating potential of the wafer W and strike the surface of the wafer W, thereby performing surface processing, e.g., etching.

Step S3: At the start of or during etching processing, the tuner 89a is operated to minimize the reflection of the microwaves to perform impedance matching. In addition, the lifting mechanism 22 is operated to adjust the height of the support table 2, as needed, thereby changing the degree of reflection of the microwaves. This adjustment can be performed in accordance with a desired mode of etching processing. For example, the adjustment may be performed to minimize the reflection of the microwaves or slightly increase the reflection.

Step S4: When etching is performed for a predetermined period of time, supply of the microwave, magnetic field, bias potential, and etching gas is stopped, and the electrostatic chuck is dissolved. After the gas in the chamber 1 is sufficiently exhausted, the processed wafer W is unloaded through the load lock chamber 9, and the next wafer processing is started.

The present invention is not limited to microwave reflection on the support surface of the support table. For example, in order to reflect a microwave on the surface of, e.g., the wafer, the distance from the surface of the wafer to the microwave inlet ports may be set to be an integer multiple of ½ the wavelength of the microwave. In this case, even if an object to be processed is thick, absorption of the microwave power by the object can be prevented, resulting in convenience.

Figure 9:
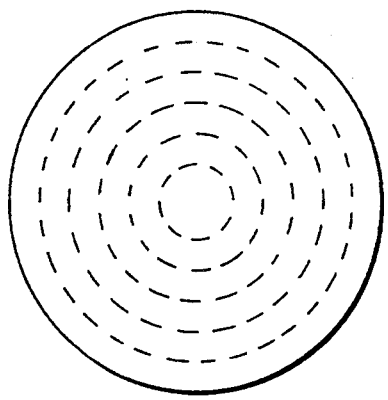
FIG. 9 is a plan view showing the structure of another metal plate having microwave inlet ports.

According to the present invention, a microwave antenna formed of a conductive plate as a disc-like metal plate and bonded to a dielectric body, e.g., a ceramic plate may be arranged in the plasma generation chamber 1. This conductive plate has a diameter of, e.g., 500 mm and a thickness of, e.g., 0.3 mm, which is sufficiently large conductor with respect to the wavelength of the microwave. Slots (elongated holes) serving as microwave inlet ports and having a length of ½ the in-tube wavelength of the microwave are formed in the conductive plate. Specifically, the slots may have a length of about 2 cm, and a width of from 1 to 5 mm, and arranged coaxially, as shown in FIG. 9.

The present invention is applicable to an ECR plasma processing apparatus having a structure in which a microwave is not reflected by a support table or a target object. The present invention is also applicable to various plasma surface processing operations such as etching, ashing, and CVD. In this case, it is preferable to provide an implementation such as addition of a structure for heating or cooling a support table.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. An apparatus for generating a plasma by an electron cyclotron resonance and processing a substrate by using this plasma, comprising:

a processing chamber;

means for setting said chamber in a vacuum atmosphere;

a support table disposed in said chamber, said support table having a support surface for supporting the substrate, and said chamber defining a discharge space above said support surface;

gas supplying means for supplying a processing gas to be converted into the plasma in said chamber;

first and second magnetic poles respectively located on upper and lower sides of the discharge space, and both located outside said chamber, in order to form a magnetic field in the discharge space;

means for adjusting the strength of the magnetic field;

a microwave transmission window formed in said chamber to oppose the discharge space;

a first conductive plate arranged on said microwave transmission window outside said chamber, a plurality of slits formed in said first conductive plate and serving as microwave inlet ports;

a dielectric plate adjoining said first conductive plate;

a second conductive plate adjoining said dielectric plate with no gap therebetween; and microwave supply means for supplying a microwave to said first conductive plate, and comprising a coaxial line constituted by a central conductor and an outer conductive pipe, an end of said central conductor being guided to a central portion of an upper surface of said dielectric plate without contacting said second conductive plate so as to form transmission paths of the microwave from the central portion to peripheral portions in said dielectric plate.

2. An apparatus according to claim 1, wherein said central conductor penetrates said dielectric plate and is connected to said first conductive plate, and said outer conductive pipe is connected to said second conductive plate.

3. An apparatus according to claim 1, wherein said microwave inlet ports are located opposite to said support surface, and a distance from said support surface or a surface of said substrate to said microwave inlet ports is set to be an integer multiple of ½ a wavelength of the microwave.

4. An apparatus according to claim 1, wherein said dielectric plate essentially consists of a ceramic material.

5. An apparatus according to claim 2, wherein said coaxial line is connected to a microwave generator through a coaxial converter and a waveguide.

6. An apparatus according to claim 5, wherein a tuner for adjusting impedance matching is arranged in said waveguide.

7. An apparatus according to claim 3, wherein said support surface is formed to support a semiconductor wafer.

8. An apparatus according to claim 7, wherein said gas supply means comprises etching gas supply means.

9. An apparatus according to claim 8, further comprising means for applying an RF bias potential to said support surface, said support surface being constituted by a conductor.

10. An apparatus according to claim 8, wherein a coolant path for cooling said support surface is arranged in said support table.

11. An apparatus according to claim 9, wherein electrostatic chuck means for fixing the wafer on said support surface is arranged in said support table.

12. An apparatus according to claim 7, further comprising lift means for vertically moving said support table.

13. An apparatus according to claim 12, further comprising means for applying an RF bias potential to said support surface, said support surface being constituted by a conductor, a coolant path, formed in said support table, for cooling said support surface, and electrostatic chuck means for fixing the wafer on said support surface, and wherein said lift means comprises a hollow lifting rod extending through said chamber, said bias potential applying means, said coolant path, and said electrostatic chuck means communicating with associated members outside said chamber through said hollow lifting rod.

14. An apparatus according to claim 1, wherein said support table is conductive and is electrically isolated from the chamber.

15. An apparatus according to claim 1, wherein said slits comprise T-shaped slits and are arranged along a spiral line.

* * * * *